United States Patent
Wang

(10) Patent No.: US 11,184,034 B2
(45) Date of Patent: Nov. 23, 2021

(54) METHOD AND DEVICE FOR DECODING STAIRCASE CODE, AND STORAGE MEDIUM

(71) Applicant: XI'AN ZHONGXING NEW SOFTWARE CO., LTD., Shaanxi (CN)

(72) Inventor: Weiming Wang, Guangdong (CN)

(73) Assignee: XI'AN ZHONGXING NEW SOFTWARE CO., LTD., Shaanxi (CN)

(*) Notice: Subject to any disclaimer, the term of this patent is extended or adjusted under 35 U.S.C. 154(b) by 0 days.

(21) Appl. No.: 16/764,597

(22) PCT Filed: Nov. 15, 2018

(86) PCT No.: PCT/CN2018/115531
§ 371 (c)(1),
(2) Date: May 15, 2020

(87) PCT Pub. No.: WO2019/096184
PCT Pub. Date: May 23, 2019

(65) Prior Publication Data
US 2021/0175908 A1   Jun. 10, 2021

(30) Foreign Application Priority Data
Nov. 15, 2017   (CN) .......................... 201711133350.5

(51) Int. Cl.
*H03M 13/45* (2006.01)
*H03M 13/29* (2006.01)
*H04L 1/00* (2006.01)

(52) U.S. Cl.
CPC ..... *H03M 13/458* (2013.01); *H03M 13/2909* (2013.01); *H04L 1/0042* (2013.01); *H04L 1/0047* (2013.01); *H04L 1/0057* (2013.01)

(58) Field of Classification Search
CPC ............ H03M 13/458; H03M 13/2909; H04L 1/0057; H04L 1/0042; H04L 1/0047
See application file for complete search history.

(56) References Cited

U.S. PATENT DOCUMENTS

2012/0266051 A1* 10/2012 Farhoodfar ....... H03M 13/2918
                                                                    714/782
2014/0153625 A1   6/2014 Vojcic et al.
(Continued)

FOREIGN PATENT DOCUMENTS

CN     105429646 A     3/2016
CN     106992841 A     7/2017
(Continued)

OTHER PUBLICATIONS

International Search Report for the International Patent Application No. PCT/CN2018/115531, dated Feb. 15, 2019, 2 pages.
(Continued)

*Primary Examiner* — Thien Nguyen
(74) *Attorney, Agent, or Firm* — Kacvinsky Daisak Bluni PLLC

(57) ABSTRACT

Provided is a method for decoding a staircase code. The method includes following steps: soft information updating is performed on S initial encoding blocks in a staircase code to obtain a first information block, and last S–T encoding blocks in the first information block and T newly-added encoding blocks are updated to obtain a second information block; decoding is performed on first T encoding blocks in the first information block and first S–T encoding blocks in the second information block to obtain a third information block; and following operations are repeatedly performed: S–T information blocks are selected, the soft information updating is performed to obtain S updated information blocks, and the S updated information blocks are used as a new second information block; and decoding is performed to (Continued)

obtain a new third information block, and information of first T blocks is outputted as the output of the decoder.

16 Claims, 4 Drawing Sheets

(56) References Cited

U.S. PATENT DOCUMENTS

| | | | | |
|---|---|---|---|---|
| 2016/0308558 | A1* | 10/2016 | Farhoodfar | H03M 13/2906 |
| 2019/0058493 | A1* | 2/2019 | Khayat | H03M 13/2927 |
| 2020/0220653 | A1* | 7/2020 | Yin | H04L 1/0052 |

FOREIGN PATENT DOCUMENTS

| | | | |
|---|---|---|---|
| DE | 102012220334 | B3 | 11/2013 |
| JP | 2020516119 | A | 5/2020 |
| WO | 2016089157 | A1 | 6/2016 |
| WO | 2017178264 | A1 | 10/2017 |

OTHER PUBLICATIONS

Smith et al., "Staircase Codes: FEC for 100 GB/s OTN" Journal of Lightwave Technology, vol. 30, No. 1, Jan. 1, 2012, 9 pages.

Zhang, M. Lei., "Low-Complexity Soft-Decision Concatenated LDGM-Staircase FEC for High-Bit-Rate Fiber-Optic Communication" Journal of Lightwave Technology, vol. 35, No. 18, Sep. 15, 2017, 10 pages.

Office Action for the Japanese Application No. 2020-525981, dated Jul. 27, 2021, 3 pages.

Kothiyal et al., "A Comparison of Adaptive Belief Propagation and the Best Graph Algorithm for the Decoding of Linear Block Codes" Proceedings. International Symposium on Information Theory, 2005. ISIT 2005., 2005, pp. 724-728.

Sheikh et al., "Iterative Bounded Distance Decoding of Product Codes with Scaled Reliability" 20180-arXiv: 1805.05270, 3 pages.

Jian et al., "Iterative Hard-Decision Decoding of Braided BCH Codes for High-Speed Optical Communication" Globecom 2013—Optical Networks and Systems Symposium, 6 pages.

European Search Report for the European Patent No. 18/878,903, dated Jul. 2, 2021, 9 pages.

* cited by examiner

METHOD AND DEVICE FOR DECODING STAIRCASE CODE, AND STORAGE MEDIUM

CROSS-REFERENCE TO RELATED APPLICATIONS

This is a National Stage Application, filed under 35 U.S.C. 371, of International Patent Application No. PCT/CN2018/115531, filed on Nov. 15, 2018, which claims priority to Chinese patent application No. 201711133350.5 filed on Nov. 15, 2017, contents of both of which are incorporated herein by reference in their entireties.

TECHNICAL FIELD

The present application relates to the field of communications, and in particular, to a method and apparatus for decoding a staircase code, and a storage medium.

BACKGROUND

Forward Error Correction (FEC) is a key technology of reliable transmission in high-speed digital communication system. According to the FEC, certain redundancy is added at a transmitting end according to certain coding rules, and a receiving end utilizes a decoding technology to correct errors introduced in a transmission process. In a typical transmission system shown in FIG. 1, after data from a source is processed by an encoder, the data is modulated into signals suitable for transmission. These signals enter into a channel and are interfered by noise. The data from the transmitting end is restored by a demodulator and a decoder at the receiving end, and finally ends at a sink. Net Coding Gain (NCG) is an important index to measure an error correction capability of the FEC. The larger the NCG, the more errors introduced in the transmission process can be corrected. In other words, it is possible to provide more reliable transmission or signal transmission at lower system power consumption.

Shannon has published a paper of a great significance in the field of error control in 1948, and the paper has proved that as long as information transmission rate is lower than a channel capacity, the errors introduced by noisy channels can be reduced to any low level without sacrificing the information transmission rate by properly encoding for information. Since Shannon's work was published, scientists have done a lot of fruitful work in designing effective coding and decoding methods to control the errors in a noisy environment. From the hard decision FEC represented by Hamming codes, Bose, Ray-Chaudhuri and Hocquenghem (BCH)/Reed-solomon codes (RS codes), Product Codes and Convolutional Codes to the soft decision FEC represented by Low-density Parity-check (LDPC) codes and turbo codes, and from related methods represented by block codes of absolute coding to the convolutional codes, the scientists continuously explore to achieve FEC codes with higher encoding gain at low complexity in hardware.

A staircase code is an FEC code with codeword correlation based on a structure of the product codes, and a basic principle of the staircase code is shown in FIGS. 2 and 3. In a block matrix shown in FIG. 2, the source each inputs m(m-r) information symbols to form an information matrix block of $B_{i,L}$, and adjacent mr symbols are staircase code check bits, which form a check matrix block of $B_{i,R}$. A method for generating the check matrix block of $B_{i,R}$ is shown in FIG. 2, and the check matrix block of $B_{i,R}$ is obtained by coding $[B_{i-1}^T \ B_{i,L}]$ through (2 m, 2 m-r) block codes, where $B_{i-1}^T$ is transposition of a block matrix $B_{i-1}$. For example, $B_{1,R}$ is obtained by encoding $[B_0^T \ B_{1,L}]$ through (2 m, 2 m-r) block codes with the number of m, where $B_0^T$ is an initial block of the staircase code and is a known symbol (for example, an all-zero symbol). Subsequent $B_{i,R}$ is successively obtained by encoding $[B_{i-1}^T \ B_{i,L}]$ through the (2 m, 2 m-r) block codes, and a code structure in a form of an infinite "staircase" is formed, as shown in FIG. 3.

It can be seen from the structure of the staircase code, in addition to the symbols in the known block matrix of $B_0^T$, the symbols in other block matrices are protected by two-layer (2 m, 2 m-r) block codes, and the correlation between codewords is continuously passed on. These characteristics ensure the excellent error correction capability of the staircase codes. It is mentioned in an original literature of the staircase code "Staircase Codes: FEC for 100 Gb/s OTN" that NCG achieved by a staircase code of 6.67% overhead (OH) compatible with ITU-T standard G.709 protocol is 0.42 dB improvement over NCG of the code with best performance in G.975.1 standard when the system output error rate is $10^{-15}$. Since the staircase code has excellent hard decoding performance, many manufacturers are actively promoting the staircase code of 6.67% OH as the standard for 100 G metro application recently.

Although the hard decoding performance of the staircase code has been widely concerned, the soft decoding performance of the staircase code has not been disclosed, and decoding methods mentioned in the original literatures of the staircase code is merely suitable for hard decoding. For the same code length and redundancy, the block codes used in the staircase code utilize the correlation between codewords, so that compared with the block code used in Turbo Product Code (TPC), the error correction capability and the minimum distance characteristic of the block code used in the staircase code are weakened. Therefore, the reduction of the minimum distance may lead to an occurrence of error floor phenomenon. Thus, for the method for the soft decoding of the staircase code, how to reasonably and efficiently utilize the characteristic of the correlation between codewords is especially important. An encoding method applicable to both hard coding and soft coding does not exist in the related art.

SUMMARY

The following is a summary of the subject matter described herein in detail. This summary is not intended to limit the scope of the claims.

The present application provides a method and apparatus for decoding a staircase code, and a storage medium, to avoid the condition that an encoding method applicable to both hard coding and soft coding does not exist in the related art.

The present application provides a method for decoding a staircase code. The method includes following steps: soft information updating is performed on S initial encoding blocks in a staircase code to obtain a first information block, and last S−T encoding blocks in the first information block and T newly-added encoding blocks are updated to obtain a second information block, where S and T are both integers greater than 0; decoding is performed on first T encoding blocks in the first information block and first S−T encoding blocks in the second information block to obtain a third information block, and information of first T blocks is outputted as output of a decoder; and following operations are repeatedly performed: S–T information blocks are selected from the second information block or the third information block, the soft information updating is performed on the selected S–T information blocks and the T newly-added encoding blocks to obtain S updated information blocks, and the S updated information blocks are used as a new second information block; and decoding is performed on information of (T+1)-th to 2T-th blocks in the third information block and information of first S–T blocks in the new second information block to obtain a new third information block, and information of first T blocks is outputted as output of the decoder.

The present application further provides an apparatus for decoding a staircase code. The apparatus includes an updating module, a decoding module and a processing module. The updating module is configured to perform soft information updating on S initial encoding blocks in a staircase code to obtain a first information block, and update last S–T encoding blocks in the first information block and T newly-added encoding blocks to obtain a second information block, where S and T are both integers greater than 0. The decoding module is configured to perform decoding on first T encoding blocks in the first information block and first S–T encoding blocks in the second information block to obtain a third information block, and output information of first T blocks as output of a decoder. The processing module is configured to perform repeatedly following operations of: selecting S–T information blocks from the second information block or the third information block, performing the soft information updating on the selected S–T information blocks and the T newly-added encoding blocks to obtain S updated information blocks, and using the S updated information blocks as a new second information block; and performing decoding on information of (T+1)-th to 2T-th blocks in the third information block and information of first S–T blocks in the new second information block to obtain a new third information block, and outputting information of first T blocks as output of the decoder.

The present application further provides a storage medium. The storage medium includes stored programs. The programs, when executed, perform the method described above.

The present application further provides a processor. The processor is configured to execute programs. The programs, when executed, perform the method described above.

Other aspects can be understood after the drawings and the detailed description are read and understood.

DETAILED DESCRIPTION

The present application will be described hereinafter in detail with reference to the drawings and in conjunction with embodiments. It is to be noted that if not in collision, the embodiments and features therein in the present application may be combined with each other.

It is to be noted that the terms "first", "second" and the like in the description, claims and drawings of the present application are used for distinguishing between similar objects and are not necessarily used for describing a particular order or sequence.

For an error floor phenomenon caused by an error correction capability and a minimum distance characteristic in the related art, the present application provides a method for decoding a staircase code. Soft decoding of a block TPC and the characteristic of the correlation between codewords for the staircase code are fully utilized, and a good control of the error floor phenomenon is achieved. Using the method of the present application, a type of block code to be used and a method for calculating external information are not limited, and it is applicable to multiple ways.

Figure 1:
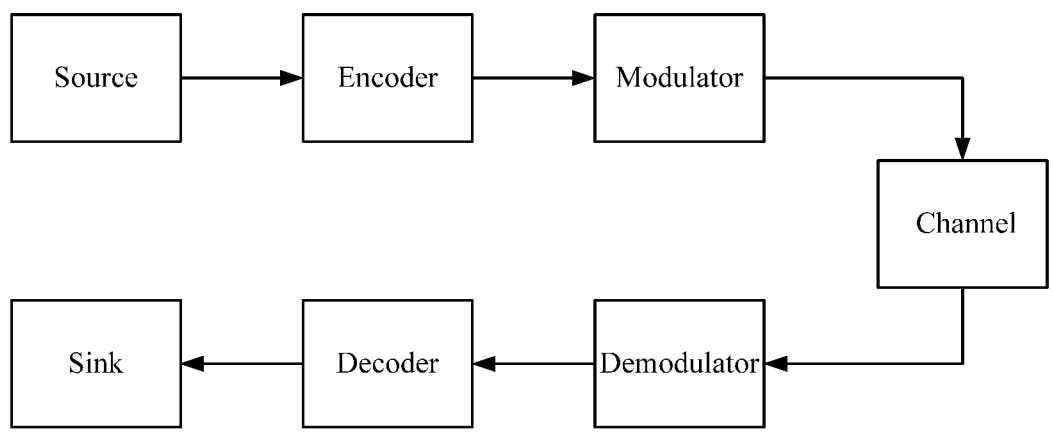
FIG. 1 is a block diagram of a typical transmission system in the related art.
Figure 2:
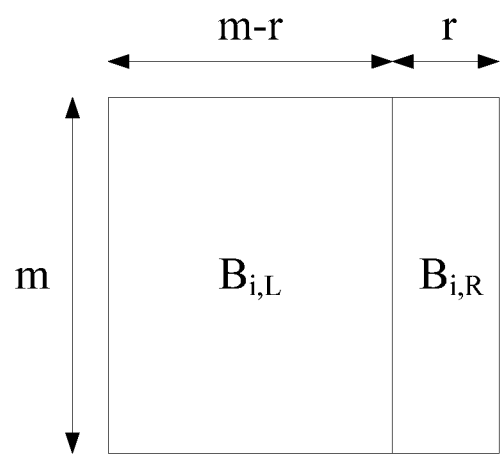
FIG. 2 is a schematic diagram of a single block structure of a staircase code in the related art.
Figure 3:
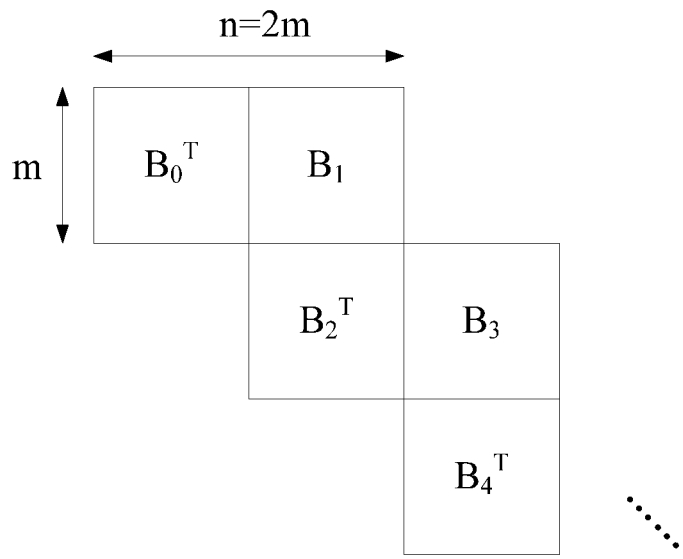
FIG. 3 is a schematic diagram of a code structure of a staircase code in the related art.
Figure 4:
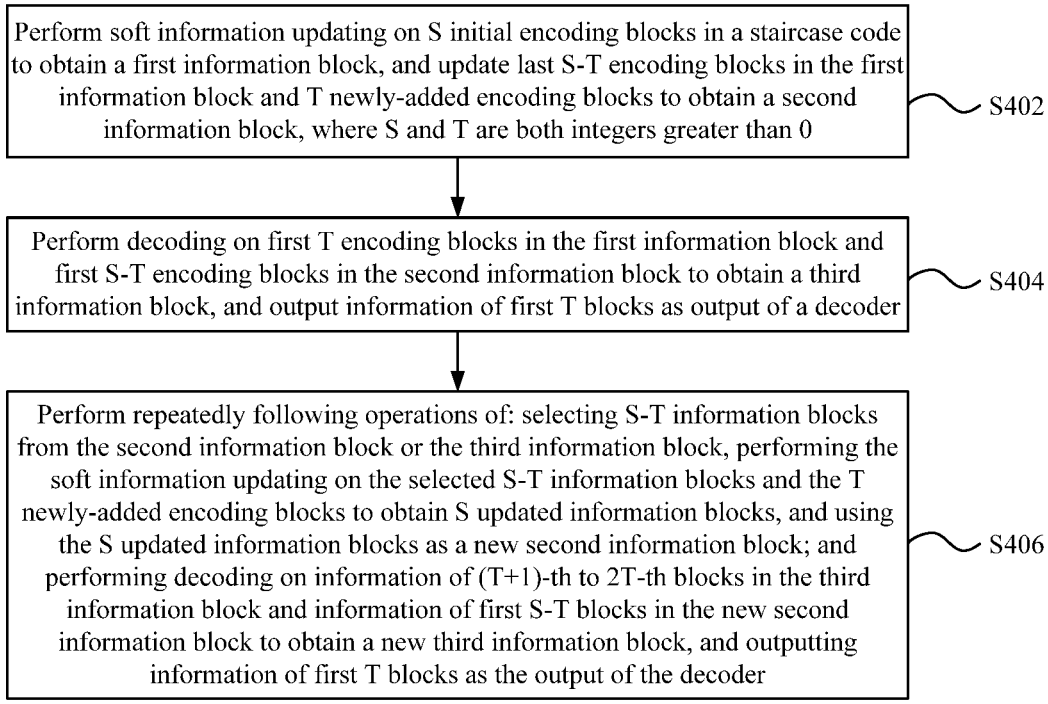
FIG. 4 is a flowchart of a method for decoding a staircase code according to an embodiment of the present application.

FIG. 4 is a flowchart of a method for decoding a staircase code according to an embodiment of the present application. As shown in FIG. 4, the method includes steps S402, S404 and S406.

In step S402, soft information updating is performed on S initial encoding blocks in a staircase to obtain a first information block, and last S–T encoding blocks in the first information block and T newly-added encoding blocks are updated to obtain a second information block, where S and T are both integers greater than 0.

In step S404, decoding is performed on first T encoding blocks in the first information block and first S–T encoding blocks in the second information block to obtain a third information block, and information of first T blocks is outputted as output of a decoder.

In step S406, following operations are repeatedly performed: selecting S–T information blocks from the second information block or the third information block, performing the soft information updating on the selected S–T information blocks and the T newly-added encoding blocks to obtain S updated information blocks, and using the S updated information blocks as a new second information block; and performing decoding on information of (T+1)-th to 2T-th blocks in the third information block and information of first S–T blocks in the new second information block to obtain a new third information block, and outputting information of first T block as the output of the decoder.

According to the embodiment described above, the soft information updating is performed on the S initial encoding blocks in the staircase code to obtain the first information block, the last S–T encoding blocks in the first information block and the T newly-added encoding blocks are updated to obtain the second information block, and decoding is performed on the first T encoding blocks in the first information block and the first S–T encoding blocks in the second information block to obtain the third information block. The soft decoding of the block TPC and the characteristic of correlation between the codewords for the staircase code are fully utilized, during subsequently repeatedly performing the steps of data block selection, updating, decoding and the like, the correlation between the codewords is ensured, and the condition that an encoding method applicable to both hard coding and soft coding does not exist in the related art is avoided, so that better waterfall region performance than the TPC is achieved, and the error floor phenomenon is well controlled.

In an embodiment, the step in which the soft information updating is performed on the S initial encoding blocks in the staircase code to obtain the first information block includes a following step: the soft information updating is performed on the S initial encoding blocks $B_i$ through $N_{1\_itr}$ iterations to obtain the first information block, where $1 \le i \le S$, and $N_{1\_itr}$ is an integer greater than 0.

In an embodiment, the step in which the soft information updating is performed on the S initial encoding blocks $B_i$ through the $N_{1\_itr}$ iterations includes a first updating processing and a second updating processing. The first updating processing is to perform the soft information updating on a code block $[B_{i-1}{}^T B_i]$, i=1 by a following formula: $[R_{i-1}{}^n, R_i{}^n] = [R_{i-1}{}^0, R_i{}^0] + [A_{i-1}{}^n, A_i{}^n] \times W_i{}^n$, n=1, where $R_i{}^0$ is original input data of the decoder corresponding to $B_i$, $R_i{}^n$ is soft information of n iterations corresponding to $B_i$, $W_i{}^n$ is external information calculated by the code block $[B_{i-1}{}^T B_i]$, $A_i{}^n$ is a reliability factor of the external information, a value range of $A_i{}^n$ is (0, 1], a value of $A_{i-1}{}^n$ is 1, and a value of $A_i{}^n$ is $n/N_{1\_itr}$.

The second updating processing is to perform the soft information updating on a code block $[R_{i-1}{}^T B_i]$, i=2, ... S−1 by the following formula: $[R_{i-1}{}^n, R_i{}^n] = [R_{i-1}{}^0, R_i{}^0] + [A_{i-1}{}^n, A_i{}^n] \times W_i{}^n$, n=1, where $A_{i-1}{}^n$ is greater than or equal to $A_i{}^n$. The first updating processing and the second updating processing are repeatedly performed for a code block $[R_{i-1}{}^T R_i]$, i=1, ... S−1, where $R_{i-1}{}^T$ is soft information of the last iteration, and $R_{i-1}{}^T$ and $R_i$ are used together as a code block to be decoded.

During performing repeatedly, n=2, ... $N_{1\_itr}$, $A_i{}^n$ is greater than or equal to $A_i{}^{n-1}$, and $N_{1\_itr}$ is configurable by a register. In an embodiment, the step in which the last S−T encoding blocks in the first information block and the T newly-added encoding blocks are updated to obtain the second information block includes a third updating processing, a fourth updating processing and a fifth updating processing. The third updating processing is to perform the soft information updating on a code block $[R_{i-1}{}^T R_i]$, i=1, ... S−T−1 by a following formula: $[R_{i-1}{}^n, R_i{}^n] = [R_{i-1}{}^0, R_i{}^0] + [A_{i-1}{}^n, A_i{}^n] \times W_i{}^n$, n=1, where $R_i{}^0$ is original input data of the decoder corresponding to an encoding block $B_i$, $R_i{}^n$ is soft information of n iterations corresponding to $B_i$, $W_i{}^n$ is external information calculated by a code block $[B_{i-1}{}^T B_i]$, $A_i{}^n$ is a reliability factor of the external information, a value range of $A_i{}^n$ is (0, 1], a value of $A_{i-1}{}^n$ is 1, and a value of $A_i{}^n$ is $n/N_{1\_itr}$. The fourth updating processing is to perform the soft information updating on a code block $[R_{i-1}{}^T B_i]$, i=S−T, by a following formula: $[R_{S-T-1}{}^n, R_{S-T}{}^n] = [R_{S-T-1}{}^0, R_{S-T}{}^0] + [A_{S-T-1}{}^n, A_{S-T}{}^n] \times W_i{}^{n-1}$, n=1. The fifth updating processing is to perform the soft information updating on a code block $[B_{i-1}{}^T B_i]$, i=S−T+1, ... S−T−1, by the following formula: $[R_{i-1}{}^n, R_i{}^n] = [R_{i-1}{}^0, R_i{}^0] + [A_{i-1}{}^n, A_i{}^n] \times W_i{}^n$, n=1. The third updating processing, the fourth updating processing and the fifth updating processing are repeatedly performed to obtain the second information block, where $A_i{}^n$ is greater than or equal to $A_i{}^{n-1}$, and during performing repeatedly, n=2, ... $N_{1\_itr}$.

In an embodiment, the step in which the decoding is performed on the first T encoding blocks in the first information block and the first S−T encoding blocks in the second information block to obtain the third information block includes one of following steps: hard decoding is performed on the first T encoding blocks in the first information block and the first S−T encoding blocks in the second information block to obtain the third information block, or soft decoding is performed on the first T encoding blocks in the first information block and the first S−T encoding blocks in the second information block to obtain the third information block.

In an embodiment, the step in which the hard decoding is performed on the first T encoding blocks in the first information block and the first S−T encoding blocks in the second information block to obtain the third information block includes following steps: soft information of the first information block and soft information of the second information block are obtained through a following formula: $[R_{i-1}{}^n, R_i{}^n] = [R_{i-1}{}^{n-1}, R_i{}^{n-1}] + W_i{}^n$, $n=N_{1\_itr}$, where $R_i{}^n$ is soft information of n iterations corresponding to an encoding block $B_i$, and $W_i{}^n$ is external information calculated by a code block $[B_{i-1}{}^T B_i]$; a hard decision is performed on the obtained soft information through a manner of: deciding a symbol bit to be 0 bit or 1 bit by corresponding a symbol bit of an element in the obtained soft information to an encoding rule; a decoding processing is performed through a manner of: successively performing (2 m, 2 m-r) block code decoding on hard decision results corresponding to $[B_{i-1}{}^T B_i]$ with the number of S−1, where i=2, ... S; and the decoding processing is repeatedly performed $N_{2\_itr}$ times, determining decoded S block data as the third information block, and first T block data is used as output of the decoder.

In an embodiment, in a case where the decoding processing is repeatedly performed $N_{2\_itr}$ times, and the block code is provided with an extended parity bit, in previous $N_{3\_itr}$ iterations, a result of (2 m, 2 m-r) block code decoding not satisfying the parity bit is iterated, to restore to current input data of the block code decoding, a subsequent iteration does not be performed a parity bit detection, and a decoding result is performed exclusive-OR (XOR) to modulo 2 to obtain a parity bit, where a value range of $N_{3\_itr}$ is [1, $N_{2\_itr}$], and $N_{2\_itr}$ is an integer greater than 0. In an embodiment, during performing repeatedly the decoding processing $N_{2\_itr}$ times, and in a case where a block code decoder processing the decoding processing feeds back an error-corrected, a current codeword sequence is restored to original input data.

In an embodiment, the step in which the soft decoding is performed on the first T encoding blocks in the first information block and the first S−T encoding blocks in the second information block to obtain the third information block includes following steps: a normalization processing is performed on the first information block and the second information block, and soft information of the first information block and soft information of the second information block are obtained through a following formula: $[R_{i-1}{}^n, R_i{}^n] = [R_{i-1}{}^0, R_i{}^0] + [A_{i-1}{}^n, A_i{}^n] \times W_i{}^n$, $n=N_{1\_itr}$, where $R_i{}^0$ is original input data of the decoder corresponding to an encoding block $B_i$, $R_i{}^n$ is soft information of n iterations corresponding to $B_i$, $W_i{}^n$ is external information calculated by a code block $[B_{i-1}{}^T B_i]$, $A_i{}^n$ is a reliability factor of the external information, a value range of $A_i{}^n$ is (0, 1], a value of $A_{i-1}{}^n$ is 1, and a value of $A_i{}^n$ is $(n-1)/N_{1\_itr}$; an output processing is repeatedly performed, where during performing repeatedly, n=2, ... $N_{2\_itr}$, and $N_{2\_itr}$ is an integer greater than 0; when the last iteration is performed, a following output processing is performed: soft information output of the decoder obtained according to the following formula is outputted: $[R_{i-1}{}^n, R_i{}^n] = [R_{i-1}{}^{n-1}, R_i{}^{n-1}] + W_i{}^n$, $n=N_{2\_itr}$; a hard decision is performed on the soft information obtained by the output processing through a manner of: deciding a symbol bit to be 0 bit or 1 bit by corresponding a symbol bit of an element in the obtained soft information to an encoding rule; and first T block data obtained through the hard decision is determined as the third information block, and the first T block data is used as output of the decoder.

In an embodiment, the step in which the S−T information blocks are selected from the second information block or the third information block includes following steps: when hard decoding is performed on the first T encoding blocks in the first information block and the first S−T encoding blocks in the second information block to obtain the third information block, S−T information blocks is selected through a manner of: discarding first T block data in the second information block to obtain the S−T information blocks; or, (2T+1)-th and N_bh blocks following the (2T+1)-th block are selected from the third information block, and original input data corresponding to the soft information of blocks from (T+N_bh+2)-th to S-th in the second information block is spliced onto the selected blocks from the third information block to act as the S−T information blocks, where a value range of N_bh is [0, S−T−1]; or when soft decoding is performed on the first T encoding blocks in the first information block and the first S−T encoding blocks in the second information block to obtain the third information block, the S−T information blocks is selected through a manner of: selecting data of the (2T+1)-th to (S+T)-th blocks from the third information block as the S−T information blocks, where a generation method is as follows: $[R_{i-1}{}^n, R_i{}^n]=[R_{i-1}{}^0, R_i{}^0]+[A_{i-1}{}^n, A_i{}^n] \times W_i{}^n$, $n=N_2\_itr$, where $R_i{}^n$ is soft information output of n iterations corresponding to $B_i$, and $W_i{}^n$ is external information calculated by a code block $[B_{i-1}{}^T B_i]$.

According to the above-mentioned embodiments, in the embodiments of the present application, the correlation between codewords is reasonably and efficiently achieved mainly through a manner described below.

Figure 5:
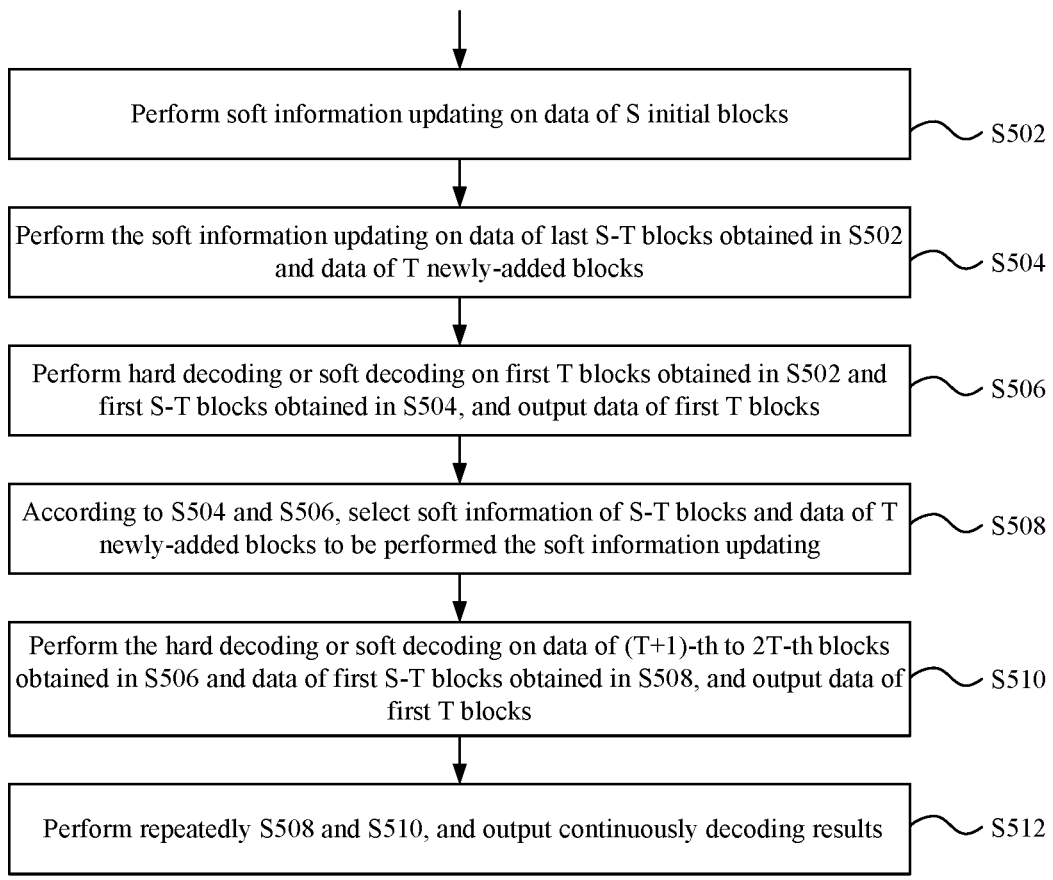
FIG. 5 is a flowchart of soft decoding of a staircase code according to an embodiment of the present application.

FIG. 5 is a flowchart of soft decoding of a staircase code according to an embodiment of the present application. As shown in FIG. 5, the method includes steps S502 to S512.

In step S502, soft information updating is performed on S initial $B_i$ blocks, $B_0, B_1, B_{T-1}, B_T, \ldots B_{S-1}$, to obtain $B_0{}^1, B_1{}^1, \ldots B_{T-1}{}^1, B_T{}^1, \ldots B_{S-1}{}^1$, where a parameter S represents the number of data blocks in each soft decoding and a parameter T represents the number of newly-added data blocks in the next decoding. The parameter S and the parameter T are configurable by a register.

In step S504, the soft information updating is performed on the soft information $B_T{}^1, \ldots B_{S-1}{}^1$ obtained in the step S502 and newly-added data blocks $B_S, B_{S+1}, \ldots B_{S+T-1}$ to obtain $B_T{}^2, \ldots B_{S-1}{}^2, B_S{}^1, B_{S+1}{}^1, \ldots B_{S+T-1}{}^1$.

In step S506, the hard decoding or soft decoding is performed on the soft information $B_0{}^1, B_1{}^1, \ldots B_{T-1}{}^1$ obtained in the step S502 and the soft information $B_T{}^2, \ldots B_{S-1}{}^2$ obtained in the step S504 to obtain $B_0{}^2, B_1{}^2, \ldots B_{T-1}{}^2, B_T{}^3, \ldots B_{S-1}{}^3$, and data of $B_0{}^2, B_1{}^2, \ldots B_{T-1}{}^2$ is outputted to obtain an output result of a decoder.

In step S508, according to different decoding methods in the step S506, the soft information of the last S−T blocks and data of T newly-added block are selected to be performed the soft information updating, and the soft information data of S updated block is obtained.

In step S510, the hard decoding or soft decoding is performed on data of (T+1)-th to 2T-th blocks obtained in the step S506 and data of first S−T blocks obtained in the step S508, and data of first T blocks is outputted as output of the decoder.

In step S512, the steps S508 and S510 are repeatedly performed to obtain T block stream data continuously output by the decoder.

In an embodiment, for the step in which the soft information updating is performing on the S initial $B_i$ blocks in the step S502, a working process includes steps one to three described below.

In step one, the soft information updating is performed on a code block $[B_0{}^T B_1]$, and an updating method is as follows: $[R_0{}^n, R_1{}^n]=[R_0{}^0, R_1{}^0]+[A_0{}^n, A_1{}^n] \times W_i{}^n$, $n=1$, where $R_i{}^0$ is original input data of the decoder corresponding to $B_i$, $R_i{}^n$ is soft information of n iterations corresponding to $B_i$, $W_i{}^n$ is external information calculated by a code block $[B_{i-1}{}^T B_i]$, $A_i{}^n$ is a reliability factor of the external information, a value range of $A_i{}^n$ is (0, 1], a value of $A_0{}^0$ is 1, and a value of $A_1{}^0$ is a smaller value.

In step two, the soft information updating is performed on a code block $[R_{i-1}{}^T B_i]$, and an updating method is as follows: $[R_{i-1}{}^n, R_i{}^n]=[R_{i-1}{}^0, R_i{}^0]+[A_{i-1}{}^n, A_i{}^n] \times W_i{}^n$, $n=1$, where $A_{i-1}{}^1$ is greater than or equal to $A_i{}^1$.

In step three, the soft information updating in the steps one and two are repeatedly performed on a code block $[R_{i-1}{}^T R_i]$, $i=1, \ldots S-1$ for n times, where $n=2, \ldots N_1\_itr$, to obtain final soft information data, where $A_i{}^n$ is greater than or equal to $A_i{}^{n-1}$, and $N_1\_itr$ is configurable by the register.

In an embodiment, for the step in which the soft information updating is performed on $B_i$ with the number of S in the step S504, a working process includes steps one to four described below.

In step one, the soft information updating is performed on the code block $[R_{i-1}{}^T R_i]$, $i=1, \ldots S-T-1$, and the updating method is as follows: $[R_{i-1}{}^n, R_i{}^n]=[R_{i-1}{}^0, R_i{}^0]+[A_{i-1}{}^n, A_i{}^n] \times W_i{}^n$, $n=1$, where $R_i{}^0$ is original input data of the decoder corresponding to $B_i$, and $A_{i-1}{}^0$ is greater than and equal to $A_i{}^0$.

In step two, the soft information updating is performed on the code block $[R_{i-1}{}^T B_i]$, $i=S-T$, and the updating method is as follows: $[R_{S-T-1}{}^n, R_{S-T}{}^n]=[R_{S-T-1}{}^0, R_{S-T}{}^0]+[A_{S-T-1}{}^n, A_{S-T}{}^n] \times W_i{}^{n-1}$, $n=1$, where $A_{i-1}{}^0$ is greater than $A_i{}^0$.

In step three, the soft information updating is performed on the code block $[B_{i-1}{}^T B_i]$, $i=S-T+1, \ldots S-T-1$, and the updating method is as follows: $[R_{i-1}{}^n, R_i{}^n]=[R_{i-1}{}^0, R_i{}^0]+[A_{i-1}{}^n, A_i{}^n] \times W_i{}^n$, $\times W_i{}^n$, $n=1$, where $A_{i-1}{}^0$ is greater than or equal to $A_i{}^0$.

In step four, the steps one, two and three are repeatedly performed n times, where $n=2, \ldots N_1\_itr$, to obtain the final soft information data, where $A_i{}^n$ is greater than or equal to $A_i{}^{n-1}$.

In an embodiment, the hard decoding is performed on the $B_i$ with the number of S in the step S506, and a scheme procedure of the staircase code overlapping output hard decoding includes steps one to five described below.

In step one, the obtained soft information of the data blocks is obtained through a following formula: $[R_{i-1}{}^n, R_i{}^n]=[R_{i-1}{}^{n-1}, R_i{}^{n-1}]+W_i{}^n$, $n=N_1\_itr$, where $R_i{}^n$ is output of n iterations corresponding to $B_i$, $R_i{}^{n-1}$ is output of n−1 iterations corresponding to $B_i$, that is, input of n iterations, and $W_i{}^n$ is external information calculated by the code block $[B_{i-1}{}^T B_i]$.

In step two, a hard decision is performed on the soft information obtained in the step S502, and a hard decision method is to take a symbol bit of a corresponding symbol to correspond to an encoding rule, and decide the symbol bit to be 0/1 bit.

In step three, (2 m, 2 m-r) block code decoding is successively performed on hard decision results corresponding to $[B_{i-1}{}^T B_i]$ with the number of S−1.

In step four, the step three is repeatedly performed $N_2\_itr$ times, and the final first T block data is used as output of the decoder, where $N_2\_itr$ is configurable by the register. when the block code is provided with an extended parity bit, in previous $N_3\_itr$ iterations, a result of (2 m, 2 m-r) block code decoding not satisfying the parity bit is iterated, to restore to current input data of the block code decoding. A subsequent iteration does not be performed a parity bit detection, and a decoding result is performed exclusive-OR (XOR) to modulo 2 to obtain a parity bit. $N_3\_itr$ is configurable by the register, and a value range of $N_3\_itr$ is [1, $N_2\_itr$].

In step five, to correct a deadlock phenomenon of the decoder, during a middle iteration of decoder working, and when a block code decoder feeds back an error-corrected, a current codeword sequence is restored to original input data.

In an embodiment, after a normalization processing is performed on the $B_i$ with the number of S in the step S506, the soft decoding is performed, and a scheme procedure of the staircase code overlapping output soft decoding includes steps one to five described.

In step one, the obtained soft information of the data blocks is obtained through a following formula: $[R_{i-1}{}^n, R_i{}^n]=[R_{i-1}{}^0, R_i{}^0]+[A_{i-1}{}^n, A_i{}^n]\times W_i{}^n$, $n=N_1\_itr$, where $R_i{}^0$ is original input data of the decoder corresponding to $B_i$, $R_i{}^n$ is soft information of n iterations corresponding to $B_i$, $W_i{}^n$ is external information calculated by a code block $[B_{i-1}{}^T B_i]$, $A_i{}^0$ is a reliability factor of the external information, a value range of $A_i{}^n$ is (0, 1], and $A_{i-1}{}^0$ is greater than or equal to $A_i{}^0$.

In step two, the soft information updating is performed on data of $B_i$ blocks with the number of S obtained in the step one, and when the last iteration is performed, soft information of the decoder obtained according to a following formula is outputted: $[R_{i-1}{}^n, R_i{}^n]=[R_{i-1}{}^0, R_i{}^0]+W_i{}^n$, $n=1$.

In step three, the step two is repeatedly performed n times, where $n=2, \ldots N_2\_itr$, to obtain the final output data of the decoder, and $N_2\_itr$ is configurable by the register. The final output data of the decoder is obtained through a following formula:

$$[R_{i-1}{}^n, R_i{}^n]=[R_{i-1}{}^{n-1}, R_i{}^{n-1}]+W_i{}^n, n=N_2\_itr.$$

In step four, a hard decision is performed on the soft information obtained in the step three, and a hard decision method is to take a symbol bit of a corresponding symbol (or called as a corresponding element) to correspond to an encoding rule, and decide the symbol bit to be 0/1 bit.

In step five, the first T block data obtained in the step four is used as output of the decoder.

In an embodiment, for the step in which the S–T block soft information is selected in the step S508, a selecting process includes steps described below. If the hard decoding is adopted in the step S506, first T block data in the soft information obtained in the step S504 is discarded to obtain the S–T block soft information; or (2T+1)-th block and N_bh blocks following the (2T+1)-th block are selected form the data blocks obtained by performing the hard decoding for the step S506, and original input data corresponding to soft information of blocks from (T+N_bh+2)-th to S-th obtained in the step S504 is spliced onto the selected blocks to act as the S–T block soft information, where a value range of N_bh is [0, S–T–1], and N_bh is configurable by the register.

If the soft decoding is adopted in the step S506, the S–T data blocks are comprised of soft information data blocks from (2T+1)-th to 3T-th obtained by soft decoding in the step S506, and the S–T data blocks are obtained through a following formula: $[R_{i-1}{}^n, R_i{}^n]=[R_{i-1}{}^0, R_i{}^0]+[A_{i-1}{}^n, A_i{}^n]\times W_i{}^n$, $n=N_2\_itr$, where $R_i{}^n$ is soft information output of n iterations corresponding to $B_i$, and $W_i{}^n$ is external information calculated by a code block $[B_{i-1}{}^T B_i]$.

In an embodiment, for the step in which the soft information updating is performed on $B_i$ with the number of S in the step S508, the working process is consistent with the processing process of the steps one to four included in the above step S504.

According to the description of the embodiments described above, it will be apparent to those skilled in the art that the methods in the embodiments described above may be implemented by software plus a necessary general-purpose hardware platform, or may of course be implemented by hardware. However, in many cases, the former is a preferred implementation manner. Based on this understanding, the technical scheme of the present application substantially, or the part contributing to the related art, may be embodied in the form of a software product. The computer software product is stored in a storage medium, such as a read-only memory (ROM)/random access memory (RAM), a magnetic disk or an optical disk, and includes several instructions for enabling a terminal device, which may be a mobile phone, a computer, a server, a network device or the like, to execute the method according to each embodiment of the present application.

The embodiment further provides an apparatus for decoding a staircase code. The apparatus is configured to implement the above-mentioned embodiments and exemplary implementation modes. What has been described will not be repeated. As used below, the term "module" may be at least one of software, hardware or a combination thereof capable of implementing predetermined functions. The apparatus in the embodiment described below is preferably implemented by software, but implementation by hardware or by a combination of software and hardware is also possible and conceivable.

Figure 6:
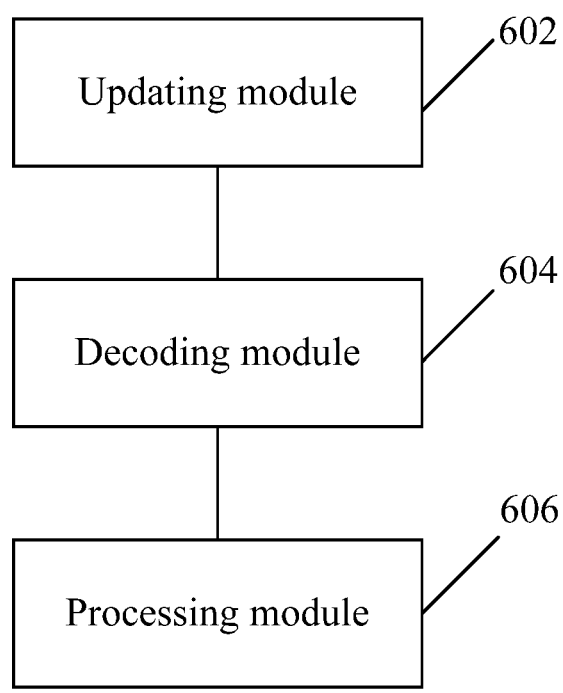
FIG. 6 is a block diagram of an apparatus for decoding a staircase code according to an embodiment of the present application.

FIG. 6 is a block diagram of an apparatus for decoding a staircase code according to an embodiment of the present application. As shown in FIG. 6, the apparatus includes an updating module 602, a decoding module 606 and a processing module 606.

The updating module 602 is configured to perform soft information updating on S initial encoding blocks in a staircase code to obtain a first information block, and update last S–T encoding blocks in the first information block and T newly-added encoding blocks to obtain a second information block, where S and T are both integers greater than 0.

The decoding module 604 is connected to the above-mentioned updating module 602 and configured to perform decoding on first T encoding blocks in the first information block and first S–T encoding blocks in the second information block to obtain a third information block, and output information of first T blocks as output of a decoder.

The processing module 606 is connected to the above-mentioned decoding module 604 and is configured to perform repeatedly following operations of: selecting S–T information blocks from the second information block or the third information block, performing the soft information updating on the selected S–T information blocks and the T newly-added encoding blocks to obtain S updated information blocks, and using the S updated information blocks as a new second information block; and performing decoding on information of (T+1)-th to 2T-th blocks in the third information block and information of first S–T blocks in the new second information block to obtain a new third information block, and outputting information of first T blocks as output of the decoder.

In an embodiment, when the soft information updating is performed on the S initial encoding blocks in the staircase code to obtain the first information block, the updating module 602 includes an updating unit, which is configured to perform the soft information updating on the S initial encoding blocks $B_i$ through $N_1\_itr$ iterations to obtain the first information block, where $1 \le i \le S$, and $N_1\_itr$ is an integer greater than 0.

In an embodiment, the above-mentioned updating unit includes a first updating processing sub-unit and a second updating processing sub-unit. The first updating processing sub-unit is configured to perform the soft information updating on a code block $[B_{i-1}^T B_i]$, i=1, by a following formula: $[R_{i-1}^n, R_i^n]=[R_{i-1}^0, R_i^0]+[A_{i-1}^n, A_i^n]\times W_i^n$, n=1, where $R_i^0$ is original input data of the decoder corresponding to $B_i$, $R_i^n$ is soft information of n iterations corresponding to $B_i$, $W_i^n$ is external information calculated by the code block $[B_{i-1}^T B_i]$, $A_i^n$ is a reliability factor of the external information, a value range of $A_i^n$ is (0, 1], a value of $A_{i-1}^n$ is 1, and a value of $A_i^n$ is n/$N_1$_itr. The second updating processing sub-unit is configured to perform the soft information updating on a code block $[R_{i-1}^T B_i]$, i=2, ... S−1, by the following formula: $[R_{i-1}^n, R_i^n]=[R_{i-1}^0, R_i^0]+[A_{i-1}^n, A_i^n]\times W_i^n$, n=1, where $A_{i-1}^n$ is greater than or equal to $A_i^n$. The first updating processing and the second updating processing are repeatedly performed for a code block $[R_{i-1}^T R_i]$, i=1, ... S−1, where during performing repeatedly, n=2, ... $N_1$_itr, $A_i^n$ is greater than or equal to $A_i^{n-1}$, and $N_1$_itr is configurable by a register.

In an embodiment, when the last S−T encoding blocks in the first information block and the T newly-added encoding blocks are updated to obtain the second information block, the updating module 602 includes a third updating processing sub-unit, a fourth updating processing sub-unit, a fifth updating processing sub-unit and a sixth updating processing sub-unit. The third updating processing sub-unit is configured to perform the soft information updating on a code block $[R_{i-1}^T R_i]$, i=1, ... S−T−1, by a following formula: $[R_{i-1}^n, R_i^n]=[R_{i-1}^0, R_i^0]+[A_{i-1}^n, A_i^n]\times W_i^n$, n=1, where $R_i^0$ is original input data of the decoder corresponding to an encoding block $B_i$, $R_i^n$ is soft information of n iterations corresponding to $B_i$, $W_i^n$ is external information calculated by a code block $[B_{i-1}^T B_i]$, $A_i^n$ is a reliability factor of the external information, a value range of $A_i^n$ is (0, 1], a value of $A_{i-1}^n$ is 1, and a value of $A_i^n$ is n/$N_1$_itr. The fourth updating processing sub-unit is configured to perform the soft information updating on a code block $[R_{i-1}^T B_i]$, i=S−T, by a following formula: $[R_{S-T-1}^n, R_{S-T}^n]=[R_{S-T-1}^0, R_{S-T}^0]+[A_{S-T-1}^n, A_{S-T}^n]\times W_i^{n-1}$, n=1. The fifth updating processing sub-unit is configured to perform the soft information updating on a code block $[B_{i-1}^T B_i]$, i=S−T+1, ... S−T−1, by the following formula: $[R_{i-1}^n, R_i^n]=[R_{i-1}^0, R_i^0]+[A_{i-1}^n, A_i^n]\times W_i^n$, n=1. The sixth updating processing sub-unit is configured to perform repeatedly operations in the third updating processing sub-unit, the fourth updating processing sub-unit and the fifth updating processing sub-unit to obtain the second information block, where $A_i^n$ is greater than or equal to $A_i^{n-1}$, and during performing repeatedly, n=2, ... $N_1$_itr.

In an embodiment, the above-mentioned decoding module 604 includes one of a hard decoding unit or a soft decoding unit. The hard decoding unit is configured to perform hard decoding on the first T encoding blocks in the first information block and the first S−T encoding blocks in the second information block to obtain the third information block. The soft decoding unit is configured to perform soft decoding on the first T encoding blocks in the first information block and the first S−T encoding blocks in the second information block to obtain the third information block.

In an embodiment, the above-mentioned hard decoding unit is configured to perform operations of: obtaining soft information of the first information block and soft information of the second information block through a following formula: $[R_{i-1}^n, R_i^n]=[R_{i-1}^{n-1}, R_{i-1}^{n-1}]+W_i^n$, n=$N_1$_itr, where $R_i^n$ is soft information of n iterations corresponding to an encoding block $B_i$, and $W_i^n$ is external information calculated by a code block $[B_{i-1}^T B_i]$; performing a hard decision on the obtained soft information through a manner of: deciding a symbol bit to be 0 bit or 1 bit by corresponding a symbol bit of an element in the obtained soft information to an encoding rule; performing a decoding processing through a manner of: successively performing (2 m, 2 m-r) block code decoding on hard decision results corresponding to $[B_{i-1}^T B_i]$ with the number of S−1, where i=2, ... S; and performing repeatedly decoding processing $N_2$_itr times, determining decoded S block data as the third information block, and using first T block data as output of the decoder.

In an embodiment, when the decoding processing is repeatedly performed $N_2$_itr times, and the block code is provided with an extended parity bit, in previous $N_3$_itr iterations, a result of (2 m, 2 m-r) block code decoding not satisfying the parity bit is iterated, to restore to current input data of the block code decoding, a subsequent iteration does not be performed a parity bit detection, and a decoding result is performed exclusive-OR (XOR) to modulo 2 to obtain a parity bit, where a value range of $N_3$_itr is [1, $N_2$_itr], and $N_2$_itr is an integer greater than 0.

In an embodiment, during performing repeatedly the decoding processing $N_2$_itr times, and when a block code decoder processing the decoding processing feeds back an error-corrected, a current codeword sequence is restored to original input data.

In an embodiment, the above-mentioned soft decoding unit is configured to perform operations of: performing a normalization processing on the first information block and the second information block, and obtaining soft information of the first information block and soft information of the second information block through a following formula: $[R_{i-1}^n, R_i^n]=[R_{i-1}^0, R_i^0]+[A_{i-1}^n, A_i^n]\times W_i^n$, n=$N_1$_itr, where $R_i^0$ is original input data of the decoder corresponding to an encoding block $B_i$, $R_i^n$ is soft information of n iterations corresponding to $B_i$, $W_i^n$ is external information calculated by a code block $[B_{i-1}^T B_i]$, $A_i^n$ is a reliability factor of the external information, a value range of $A_i^n$ is (0, 1], a value of $A_{i-1}^n$ is 1, and a value of $A_i^n$ is (n−1)/$N_1$_itr; performing repeatedly an output processing, where during performing repeatedly, n=2, ... $N_2$_itr, and $N_2$_itr is an integer greater than 0; when the last iteration is performed, performing a following output processing: outputting soft information output of the decoder obtained according to the following formula: $[R_{i-1}^n, R_i^n]=[R_{i-1}^{n-1}, R_i^{n-1}]+W_i^n$, n=$N_2$_itr; performing repeatedly an output processing performing, where during performing repeatedly, n=2, ... $N_2$_itr, and $N_2$_itr is an integer greater than 0; performing a hard decision on the soft information obtained by the output processing through a manner of: deciding a symbol bit to be 0 bit or 1 bit by corresponding a symbol bit of an element in the obtained soft information to an encoding rule; and determining first T block data obtained through the hard decision as the third information block, and using the first T block data as output of the decoder.

In an embodiment, when the S−T information blocks are selected from the second information block or the third information block, the processing module 606 is configured to perform operations of: when hard decoding is performed on the first T encoding blocks in the first information block and the first S−T encoding blocks in the second information block to obtain the third information block, selecting S−T information blocks through a manner of: discarding first T block data in the second information block to obtain the S−T information blocks; or, selecting (2T+1)-th block and N_bh blocks following the (2T+1)-th block from the third information block, and splicing original input data corresponding to soft information of blocks from (T+N_bh+2)-th to S-th in the second information block onto the selected blocks from the third information block to act as the S−T information blocks, where a value range of N_bh is [0, S−T−1]; or when soft decoding is performed on the first T encoding blocks in the first information block and the first S−T encoding blocks in the second information block to obtain the third information block, selecting the S−T information blocks through a manner of: selecting data of the (2T+1)-th to (S+T)-th blocks from the third information block as the S−T information blocks, where a generation method is as follows: $[R_{i-1}^n, R_i^n]=[R_{i-1}^0, R_i^0]+[A_{i-1}^n, A_i^n]\times W_i^n$, n=N$_2$_itr, where $R_i^n$ is soft information output of n iterations corresponding to $B_i$, and $W_i^n$ is external information calculated by a code block $[B_{i-1}^T B_i]$.

The present application is described below in conjunction with specific application scenarios. A high-performance staircase soft decoding method and decoder device applied to a long haul scenario, a low-power staircase soft decoding method and decoder device applied to a metro/data center interconnection (metro/DCI) scenario, and a staircase hard decoding method and decoder apparatus applied to a short-distance transmission interconnection scenario.

Example Embodiment One

The example embodiment one of the present application provides a high-performance staircase soft decoding procedure applied to a long haul scenario. In a long haul transmission scenario, the requirements for a net coding gain of FEC is very high, and in order to obtain a staircase code with excellent performance, the number of iterations N$_1$_itr and N$_2$_itr may be configured to be larger values according to system requirements. The procedure includes steps one to six are described below.

In step one, soft information updating is performed on S initial $B_i$ blocks, $B_0, B_i, \ldots B_{T-1}, B_T, \ldots B_{S-1}$, to obtain $B_0^1, B_1^1, \ldots B_{T-1}^1, B_T^1, \ldots B_{S-1}^1$, where a parameter S represents the number of data blocks in each soft decoding and a parameter T represents the number of newly-added data blocks in the next decoding. The parameter S and the parameter T are configurable by a register. The step of the soft information updating includes steps 1 to 3 described below.

In step 1, the soft information updating is performed on a code block $[B_0^T B_1]$, and an updating method is as follows: $[R_0^n, R_1^n]=[R_0^0, R_1^0]+[A_0^n, A_1^n]\times W_i^n$, n=1, where $R_i^0$ is original input data of a decoder corresponding to $B_i$, $R_i^n$ is soft information of n iterations corresponding to $B_i$, $W_i^n$ is external information calculated by the code block $[B_{i-1}^T B_i]$, $A_i^n$ is a reliability factor of the external information, a value range of $A_i^n$ is (0, 1], a value of $A_0^0$ is 1, and a value of $A_1^0$ is a smaller value.

In step 2, the soft information updating is performed on a code block $[R_{i-1}^T B_i]$, i=2, ... S−1, and an updating method is as follows: $[R_{i-1}^n, R_i^n]=[R_{i-1}^0, R_i^0]+[A_{i-1}^n, A_i^n]\times W_i^n$, n=1, where $A_{i-1}^1$ is greater than or equal to $A_i^1$.

In step 3, the soft information updating in the steps one and two are repeatedly performed on a code block $[R_{i-1}^T R_i]$, i=1, ... S−1 for n times, where n=2, ... N$_1$_itr, to obtain final soft information data, where $A_i^n$ is greater than or equal to $A_i^{n-1}$, and N$_1$_itr is configurable by the register.

In step two, the soft information updating is performed on the soft information $B_T^1, \ldots B_{S-1}^1$ obtained in the step one and newly-added data blocks $B_S, B_{S+1}, \ldots B_{S+T-1}$ to obtain $B_T^2, \ldots B_{S-1}^2, B_S^1, B_{S+1}^1, \ldots B_{S+T-1}^1$. The soft information updating includes step 1 to step 4 described below.

In step 1, the soft information updating is performed on the code block $[R_{i-1}^T R_i]$, i=1, ... S−T−1, and an updating method is as follows: $[R_{i-1}^n, R_i^n]=[R_{i-1}^0, R_i^0]+[A_{i-1}^n, A_i^n]\times W_i^n$, n=1, where $R_i^0$ is original input data of the decoder corresponding to $B_i$, and $A_{i-1}^0$ is greater than or equal to $A_i^0$.

In step 2, the soft information updating is performed on the code block $[R_{i-1}^T B_i]$, i=S−T, and an updating method is as follows: $[R_{S-T-1}^n, R_{S-T}^n]=[R_{S-T-1}^0, R_{S-T}^0]+[A_{S-T-1}^n, A_{S-T}^n]\times W_i^{n-1}$, n=1, where $A_{i-1}^0$ is greater than $A_i^0$.

In step 3, the soft information updating is performed on a code block $[B_{i-1}^T B_i]$, i=S−T+1, ... S−T−1, and an updating method is as follows: $[R_{i-1}^n, R_i^n]=[R_{i-1}^0, R_i^0]+[A_{i-1}^n, A_i^n]\times W_i^n$, n=1, where $A_{i-1}^0$ is greater than or equal to $A_i^0$.

In step 4, the steps 1, 2 and 3 are repeatedly performed n times, where n=2, ... N$_1$_itr, to obtain the final soft information data, where $A_i^n$ is greater than or equal to $A_i^{n-1}$.

In step three, the soft decoding and a normalization processing are performed on the soft information $B_0^1, B_1^1, \ldots B_{T-1}^1$ obtained in the step two and the soft information $B_T^2, \ldots B_{S-1}^2$ obtained in the step S506 to obtain $B_0^2, B_1^2, \ldots B_{T-1}^2, B_T^3, \ldots B_{S-1}^3$, and data of $B_0^2, B_1^2, \ldots B_{T-1}^2$ is outputted to obtain an output result of a decoder. The step three includes steps 1 to 5 described below.

In step 1, the obtained soft information of the data blocks is obtained through a following formula: $[R_{i-1}^n, R_i^n]=[R_{i-1}^0, R_i^0]+[A_{i-1}^n, A_i^n]\times W_i^n$, n=N$_1$_itr, where $R_i^0$ is original input data of the decoder corresponding to $B_i$, $R_i^n$ is soft information of n iterations corresponding to $B_i$, $W_i^n$ is external information calculated by the code block $[B_{i-1}^T B_i]$, $A_i^0$ is a reliability factor of the external information, a value range of $A_i^0$ is (0, 1], and $A_{i-1}^0$ is greater than or equal to $A_i^0$.

In step 2, the soft information updating is performed on data of $B_i$ blocks with the number of S, obtained in the step 1, and when the last iteration is performed, soft information of the decoder obtained according to a following formula is outputted: $[R_{i-1}^n, R_i^n]=[R_{i-1}^0, R_i^0]+W_i^n$, n=1.

In step 3, the step 2 is repeatedly performed n times, where n=2, ... N$_2$_itr, to obtain the final output data of the decoder, and N$_2$_itr is configurable by the register. The final output data of the decoder is obtained through a following formula:

$$[R_{i-1}^n, R_i^n]=[R_{i-1}^{n-1}, R_i^{n-1}]+W_i^n, n=N_2\_itr.$$

In step 4, a hard decision is performed on the soft information obtained in the step 3, and a hard decision method is to take a symbol bit of a corresponding symbol to correspond to an encoding rule, and decide the symbol bit to be 0/1 bit.

In step 5, the first T block data obtained in the step 4 is used as output of the decoder.

In step four, soft information of S−T blocks and data of T newly-added block are selected to be performed the soft information updating, and soft information data of S updated blocks is obtained. The step four includes steps 1 and 2 described below.

In step 1, the S−T data blocks are comprised of soft information data blocks from (2T+1)-th to 3T-th obtained by soft decoding in the step three, and the S−T data blocks are obtained through a following formula: $[R_{i-1}^n, R_i^n]=[R_{i-1}^0, R_i^0]+[A_{i-1}^n, A_i^n]\times W_i^n$, n=N$_2$_itr, where $R_i^n$ is soft information output of n iterations corresponding to $B_i$, and $W_i^n$ is external information calculated by the code block $[B_{i-1}^T B_i]$.

In step 2, the soft information updating is performed on processing procedures of the steps 1 to 4 included in the step two.

In step five, the hard decoding or soft decoding is performed on data of (T+1)-th to 2T-th blocks obtained in the step three and first S−T block data obtained in the step four, and the first T block data is outputted as output of the decoder.

In step six, the steps four and five are repeatedly performed to obtain T block stream data continuously output by the decoder.

Example Embodiment Two

The example embodiment two of the present application provides a low-power staircase soft decoding procedure applied to a metro/DCI scenario. In a metro/data center interconnection scenario, the power consumption and delay requirements for FEC are very high on the premise of satisfying the system net coding gain, and in order to satisfy a required staircase code, iteration times $N_1\_itr$ and $N_2\_itr$ may be configured to smaller values according to the system requirements, and a hard decision staircase scheme with less power consumption and delay may be used at an overlap location. The procedure includes steps one to six described below.

In step one, soft information updating is performed on S initial $B_i$ blocks, $B_0, B_1, \ldots B_{T-1}, B_T, \ldots B_{S-1}$, to obtain $B_0^1, B_1^1, \ldots B_{T-1}^1, B_T^1, \ldots B_{S-1}^1$, where a parameter S represents the number of data blocks in each soft decoding and a parameter T represents the number of newly-added data blocks in the next decoding. The parameter S and the parameter T are configurable by a register. The step of the soft information updating includes steps 1 to 3 described below.

In step 1, the soft information updating is performed on a code block $[B_0^T B_1]$, and an updating method is as follows: $[R_0'', R_1''] = [R_0^0, R_1^0] + [A_0'', A_1''] \times W_i''$, n=1, where $R_i^0$ is original input data of a decoder corresponding to $B_i$, $R_i''$ is soft information of n iterations corresponding to $B_i$, $W_i''$ is external information calculated by a code block $[B_{i-1}^T B_i]$, $A_i''$ is a reliability factor of the external information, a value range of $A_i''$ is (0, 1], a value of $A_0^0$ is 1, and a value of $A_i^0$ is a smaller value.

In step 2, the soft information updating is performed on a code block $[R_{i-1}^T B_i]$, i=2, … S−1, and an updating method is as follows: $[R_{i-1}'', R_1''] = [R_{i-1}^0, R_i^0] + [A_{i-1}'', A_i''] \times W_i''$, n=1, where $A_{i-1}^1$ is greater than or equal to $A_i^1$.

In step 3, the soft information updating in the steps 1 and 2 are repeatedly performed on a code block $[R_{i-1}^T R_i]$, i=1, … S−1 for n times, where n=2, … $N_1\_itr$, to obtain final soft information data, where $A_i''$ is greater than or equal to $A_i^{n-1}$, and $N_1\_itr$ is configurable by the register.

In step two, the soft information updating is performed on the soft information $B_T^1, \ldots B_{S-1}^1$ obtained in the step one and newly-added data blocks $B_S, B_{S-1}, \ldots B_{S+T-1}$ to obtain $B_T^2, \ldots B_{S-1}^2, B_S^1, B_{S+1}^1, \ldots B_{S+T-1}^1$. The soft information updating includes steps 1 to 4 described below.

In step 1, the soft information updating is performed on the code block $[R_{i-1}^T R_i]$, i=1, … S−T−1, and an updating method is as follows: $[R_{i-1}'', R_i''] = [R_{i-1}^0, R_i^0] + [A_{i-1}'', A_i''] \times W_i''$, n=1, where $R_i^0$ is original input data of the decoder corresponding to $B_i$, and $A_{i-1}^0$ is greater than or equal to $A_i^0$.

In step 2, the soft information updating is performed on the code block $[R_{i-1}^T B_i]$, i=S−T, and an updating method is as follows: $[R_{S-T-1}'', R_{S-T}''] = [R_{S-T-1}^0, R_{S-T}^0] + [A_{S-T-1}'', A_{S-T}''] \times W_i^{n-1}$, n=1, where $A_{i-1}^0$ is greater than $A_i^0$.

In step 3, the soft information updating is performed on a code block $[B_{i-1}^T B_i]$, i=S−T+1, … S−1, and an updating method is as follows: $[R_{i-1}'', R_i''] = [R_{i-1}^0, R_i^0] + [A_{i-1}'', A_i''] \times W_i''$, n=1, where $A_{i-1}^0$ is greater than or equal to $A_i^0$.

In step 4, the steps 1, 2 and 3 are repeatedly performed n times, where n=2, … $N_1\_itr$, to obtain the final soft information data, where $A_i''$ is greater than or equal to $A_i^{n-1}$.

In step three, the hard decoding is performed on the soft information $B_0^1, B_1^1, \ldots B_{T-1}^1$ obtained in the step one and the soft information $B_T^2, \ldots B_{S-1}^2$ obtained in the step two to obtain $B_0^2, B_1^2, \ldots B_{T-1}^2, B_T^3, \ldots B_{S-1}^3$, and data of $B_0^2, B_1^2, \ldots B_{T-1}^2$ is outputted to obtain an output result of a decoder. The step three includes steps 1 to 5 described below.

In step 1, the obtained soft information of the data blocks is obtained through a following formula: $[R_{i-1}'', R_i''] = [R_{i-1}^{n-1}, R_i^{n-1}] + W_i''$, n=$N_1\_itr$, where $R_i''$ is output of n iterations corresponding to $B_i$, $R_i^{n-1}$ is output of n−1 iterations corresponding to $B_i$, that is, input of n iterations, and $W_i''$ is external information obtained by the code block $[B_{i-1}^T B_i]$.

In step 2, a hard decision is performed on the soft information obtained in the step one, and a hard decision method is to take a symbol bit of a corresponding symbol to correspond to an encoding rule, and decide the symbol bit to be 0/1 bit.

In step 3, (2 m, 2 m-r) block code decoding is successively performed on hard decision results corresponding to $[B_{i-1}^T B_i]$ with the number of S−1, i=2, … S.

In step 4, the step 3 is repeatedly performed $N_2\_itr$ times, and the final first T block data is used as output of the decoder, where $N_2\_itr$ is configurable by the register. When the block code is provided with an extended parity bit, in previous $N_3\_itr$ iterations, a result of (2 m, 2 m-r) block code decoding not satisfying the parity bit is iterated, to restore to current input data of the block code decoding. A subsequent iteration does not be performed a parity bit detection, and a decoding result is performed exclusive-OR (XOR) to modulo 2 to obtain a parity bit. $N_3\_itr$ is configurable by the register and a value range of $N_3\_itr$ is [1, $N_2\_itr$].

In step 5, to correct a deadlock phenomenon of the decoder, during a middle iteration of decoder working, and when a block code decoder feeds back an error-corrected, a current codeword sequence may be restored to original input data.

In step four, the soft information of S−T blocks and data of T newly-added blocks are selected to be performed the soft information updating, and soft information data of S updated blocks is obtained. The step four includes steps 1 and 2 described below.

In step 1, the first T block data in the soft information obtained in the step two is discarded to obtain the S−T block soft information; or (2T+1)-th block and N_bh blocks following the (2T+1)-th block are selected form the data blocks obtained by performing the hard decoding for the step S506, and original input data corresponding to soft information of blocks from (T+N_bh+2)-th to S-th obtained in the step two is spliced onto the selected blocks to act as the S−T block soft information, where a value range of N_bh is [0, S−T−1], and N_bh is configurable by the register.

In step 2, the soft information updating is performed on processing procedures of the steps 1 to 4 included in the step two.

In step five, the hard decoding or soft decoding is performed on data of (T+1)-th to 2T-th blocks obtained in the step three and first S−T block data obtained in the step four, and the first T block data is outputted as output of the decoder.

In step six, the steps four and five are repeatedly performed to obtain T block stream data continuously output by the decoder.

Exemplary Embodiment Three

The exemplary embodiment three of the present application provides a staircase hard decoding procedure applied to a short-distance transmission interconnection scenario. In a short-distance transmission interconnection scenario, the net coding gain requirement for FEC hard decision is very high, so that the control of error floor phenomenon is more important. In order to obtain a staircase code that satisfies the requirements, steps one to six described below may be performed.

In step one, hard decoding is performed on S initial $B_i$ blocks, $B_0^1, B_1, \ldots B_{T-1}, B_T, \ldots B_{S-1}$, to obtain $B_0^1$, $B_1^1, \ldots B_{T-1}^1, B_T^1, \ldots B_{S-1}^1$, where a parameter S represents the number of data blocks in each decoding and a parameter T represents the number of newly-added data blocks in the next decoding. The parameter S and the parameter T are configurable by a register.

The step one includes steps 1 to 5 described below. In step 1, a hard decision is performed on S block data to obtain S hard decision data blocks.

In step 2, (2 m, 2 m-r) block code hard decoding is performed on a code block $[B_0^T B_1]$, and the updated code block data is recorded as $[H_0^T H_1]$, where i=1, ... S−1.

In step 3, the (2 m, 2 m-r) block code hard decoding is performed on a code block $[H_i^T B_{i-1}^T]$, and the updated data is $[H_i^T H_{i-1}]$, where i=2, ... S−1.

In step 4, the (2 m, 2 m-r) block code hard decoding is performed on the updated code block $[H_i H_{i-1}^T]$, where i=S−1, ... 1.

In step 5, the steps 3 and 4 are repeatedly performed $N_{1\_itr}$ times to obtain final hard decision data, where $N_{1\_itr}$ is configurable by the register.

In step two, the hard decoding is performed on the hard decision information $B_T^1, \ldots B_{S-1}^1$ obtained in the step one and newly-added data blocks $B_S, B_{S+1}, \ldots B_{S+T-1}$ to obtain $B_T^2, \ldots B_{S-1}^2, B_S^1, B_{S+1}^1, \ldots B_{S+T-1}^1$, and the method is as the step one.

In step three, the hard decoding is performed on the hard decision information $B_0^1, B_1^1, \ldots B_{T-1}^1$ obtained in the step one and the hard decision information $B_T^2, \ldots B_{S-1}^2$ obtained in the step two to obtain $B_0^2, B_1^2, \ldots B_{T-1}^2$, $B_T^3, \ldots B_{S-1}^3$, and data of $B_0^2, B_1^2, \ldots B_{T-1}^2$ is outputted to obtain an output result of a decoder.

The step three includes steps 1 to 4 described below.

In step 1, the (2 m, 2 m-r) block code hard decoding is successively performed on $[B_{i-1}^T B_i]$ code blocks with the number of S−1, where i=2, ... S.

In step 2, the (2 m, 2 m-r) block code hard decoding is successively performed on $[B_i B_{i-1}^T]$ code blocks with the number of S−1, where i=S−1, ... 1.

In step 3, the steps 1 and 2 are repeatedly performed $N_{2\_itr}$ times to obtain final decoding output data, where $N_{2\_itr}$ is configurable by the register. When the block code is provided with an extended parity bit, in previous several iterations, a result of (2 m, 2 m-r) block code decoding not satisfying the parity bit is iterated, to restore to current input data of the block code decoding. Subsequent several iterations do not be performed a parity bit detection, and a decoding result is performed exclusive-OR (XOR) to modulo 2 to obtain a parity bit.

In step 4, to correct a deadlock phenomenon of the decoder, during a middle iteration of decoder working, and when a block code decoder feeds back an error-corrected, a current codeword sequence is restored to original input data.

In step four, the hard decoding is performed on data blocks from (2T+1)-th to 3T-th obtained in step three and T new-added block data.

In step five, the hard decoding is performed on data of (T+1)-th to 2T-th blocks obtained after the soft decoding in the step three and first S−T block data obtained in the step four, and the first T block data is outputted as output of the decoder.

In step six, the steps four and five are repeatedly performed to obtain T block stream data continuously output by the decoder.

An embodiment of the present application further provides a storage medium. The storage medium includes stored programs. The programs, when executed, perform the method of any one of the embodiments described above.

In an embodiment, the storage medium may include, but is not limited to, a Universal Serial Bus (USB) flash disk, an ROM, an RAM, a mobile hard disk, a magnetic disk, an optical disk or another medium capable of storing program codes.

An embodiment of the present application further provides a processor. The processor is configured to execute programs. The programs, when executed, perform the steps in the method according to any embodiment described above. For example, for exemplary examples in the embodiment, reference may be made to the examples described in the embodiments and optional implementation modes described above, and the exemplary examples will not be repeated in the embodiment.

According to the above embodiments, a following situation in the related art can be avoided: for the same code length and redundancy, compared with the block code used in the TPC code, the error correction capability and the minimum distance characteristic of the block code used in the staircase code are weakened, and the reduction of minimum distance may lead to an occurrence of error floor phenomenon. The embodiments of the present application can reasonably and efficiently utilize the correlation between codewords to avoid the situation that an encoding method applicable to both hard coding and soft coding does not exist in the related art, thus better waterfall region performance than the TPC is achieved, and the error floor phenomenon is well controlled.

What is claimed is:

1. A method for decoding a staircase code, comprising:
receiving, by a receiving device, a staircase code from a transmitting device over a channel;
performing, by the receiving device, soft information updating on S initial encoding blocks starting from an initial block $B_0^T$ in the staircase code to obtain a first information block, and updating, by the receiving device, last S−T encoding blocks in the first information block and T newly-added encoding blocks to obtain a second information block, wherein the staircase code is a forward error correction (FEC) code having correlation between adjacent codewords and defined based on a structure of a product code, the staircase code has a code structure in a form of a staircase, and S and T are both integers greater than 0;
performing, by the receiving device, decoding on first T encoding blocks in the first information block and first S−T encoding blocks in the second information block to obtain a third information block, and outputting, by the receiving device, information of first T blocks in the third information blocks as output of a decoder of the receiving device; and performing, by the receiving device, repeatedly following operations of: selecting S−T information blocks from the second information block or the third information block, performing the soft information updating on the selected S−T information blocks and the T newly-added encoding blocks to obtain S updated information blocks, and using the S updated information blocks as a new second information block; and performing decoding on information of (T+1)-th to 2T-th blocks in the third information block and information of first S−T blocks in the new second information block to obtain a new third information block, and outputting information of first T blocks in the new third information blocks as output of the decoder of the receiving device.

2. The method of claim 1, wherein performing, by the receiving device, the soft information updating on the S initial encoding blocks starting from the initial block $B_0^T$ in the staircase code to obtain the first information block comprises:

performing the soft information updating on the S initial encoding blocks $B_i$ through $N_1\_itr$ iterations to obtain the first information block, wherein $1 \leq i \leq S$, and $N_1\_itr$ is an integer greater than 0.

3. The method of claim 2, wherein performing the soft information updating on the S initial encoding blocks $B_i$ through the $N_1\_itr$ iterations comprises:

a first updating processing, which is to perform the soft information updating on a code block $[R_{i-1}^T B_i]$, i=1, by a following formula:

$$[R_{i-1}^n, R_i^n] = [R_{i-1}^0, R_i^0] + [A_{i-1}^n, A_i^n] \times W_i^n, n=1,$$

where $R_i^0$ is original input data of the decoder corresponding to $B_i$, $R_i^n$ is soft information of n iterations corresponding to $B_i$, $W_i^n$ is external information calculated by the code block $[B_{i-1}^T B_i]$, $A_i^n$ is a reliability factor of the external information, a value range of $A_i^n$ is (0, 1], a value of $A_{i-1}^n$ is 1, and a value of $A_i^n$ is $n/N_1\_itr$; and a second updating processing, which is to perform the soft information updating on a code block $[R_{i-1}^T B_i]$, i=2, ... S−1, by the following formula:

$$[R_{i-1}^n, R_i^n] = [R_{i-1}^0, R_i^0] + [A_{i-1}^n, A_i^n] \times W_i^n, n=1,$$

where $A_{i-1}^n$ is greater than or equal to $A_i^n$;

performing repeatedly the first updating process and the second updating process for a code block $[R_{i-1}^T R_i]$, i=1, . . . S−1, where during performing repeatedly, n=2, . . . $N_1\_itr$, $A_i^n$ is greater than or equal to $A_i^{n-1}$ and $N_1\_itr$ is configurable by a register.

4. The method of claim 1, wherein updating, by the receiving device, the last S−T encoding blocks in the first information block and the T newly-added encoding blocks to obtain the second information block comprises:

a third updating processing, which is to perform the soft information updating on a code block $[R_{i-1}^T R_i]$, i=1, . . . S−T−1, by a following formula:

$$[R_{i-1}^n, R_i^n] = [R_{i-1}^0, R_1^0] + [A_{i-1}^n, A_i^n] \times W_i^n, n=1,$$

where $R_i^0$ is original input data of the decoder corresponding to an encoding block $B_i$, $R_i^n$ is soft information of n iterations corresponding to $B_i$, $W_i^n$ is external information calculated by a code block $[B_{i-1}^T B_i]$, $A_i^n$ is a reliability factor of the external information, a value range of $A_i^n$ is (0, 1], a value of $A_{i-1}^n$ is 1, and a value of $A_i^n$ is $n/N_1\_itr$, wherein $N_1\_itr$ is an integer greater than 0;

a fourth updating processing, which is to perform the soft information updating on a code block $[R_{i-1}^T B_i]$, i=S−T, by a following formula;

$$[R_{S-T-1}^n, R_{S-T}^n] = [R_{S-T-1}^0, R_{S-T}^0] + [A_{S-T-1}^n, A_{S-T}^n] \times W_i^{n-1}, n=1;$$

a fifth updating processing, which is to perform the soft information updating on a code block $[B_{i-1}^T B_i]$, i=S−T+1, . . . S−T−1, by the following formula:

$$[R_{i-1}^n, R_i^n] = [R_{i-1}^0, R_i^0] + [A_{i-1}^n, A_i^n] \times W_i^n, n=1; \text{ and}$$

performing repeatedly the third updating processing, the fourth updating processing and the fifth updating processing to obtain the second information block, where $A_i^n$ is greater than or equal to $A_i^{n-1}$ and during performing repeatedly, n=2, . . . $N_1\_itr$.

5. The method of claim 1, wherein performing, by the receiving device, the decoding on the first T encoding blocks in the first information block and the first S−T encoding blocks in the second information block to obtain the third information block comprises one of:

performing hard decoding on the first T encoding blocks in the first information block and the first S−T encoding blocks in the second information block to obtain the third information block; or performing soft decoding on the first T encoding blocks in the first information block and the first S−T encoding blocks in the second information block to obtain the third information block.

6. The method of claim 5, wherein performing the hard decoding on the first T encoding blocks in the first information block and the first S−T encoding blocks in the second information block to obtain the third information block comprises:

obtaining soft information of the first information block and soft information of the second information block through a following formula:

$$[R_{i-1}^n, R_i^n] = [R_{i-1}^{n-1}, R_i^{n-1}] + W_i^n, n=N_1\_itr;$$

where $R_i^n$ is soft information of n iterations corresponding to an encoding block $B_i$, and $W_i^n$ is external information calculated by a code block $[B_{i-1}^T B_i]$, wherein $N_1\_itr$ is an integer greater than 0;

performing a hard decision on the obtained soft information through a manner of: deciding a symbol bit to be 0 bit or 1 bit by corresponding a symbol bit of an element in the obtained soft information to an encoding rule;

performing a decoding processing through a manner of: successively performing (2m, 2m-r) block code decoding on hard decision results corresponding to $[B_{i-1}^T B_i]$ with a number of S−1, where i=2, 3, . . . , S−1, S; and performing repeatedly a decoding processing $N_2\_itr$ times, determining decoded S block data as the third information block, and using first T block data as output of the decoder, wherein $N_2\_itr$ is an integer greater than 0.

7. The method of claim 6, wherein in a case where the decoding processing is repeatedly performed $N_2\_itr$ times, and a block code is provided with an extended parity bit, in previous $N_3\_itr$ iterations, a result of (2m, 2m-r) block code decoding not satisfying the extended parity bit is iterated, to restore to current input data of the (2m, 2m-r) block code decoding, a subsequent iteration does not be performed a parity bit detection, and a decoding result is performed exclusive-OR (XOR) to modulo 2 to obtain the extended parity bit, wherein a value range of $N_3\_itr$ is $[1, N_2\_itr]$, and $N_2\_itr$ is an integer greater than 0.

8. The method of claim 6, wherein during performing repeatedly the decoding processing $N_2\_itr$ times, and in a case where a block code decoder processing the decoding processing feeds back an error-corrected, a current codeword sequence is restored to original input data.

9. The method of claim 5, wherein performing the soft decoding on the first T encoding blocks in the first information block and the first S−T encoding blocks in the second information block to obtain the third information block comprises:

performing a normalization processing on the first information block and the second information block, and obtaining soft information of the first information block and soft information of the second information block through a following formula:

$$[R_{i-1}{}^n, R_i{}^n] = [R_{i-1}{}^0, R_i{}^0] + [A_{i-1}{}^n, A_i{}^n] \times W_i{}^n, n = N_1\_itr;$$

where $R_i{}^0$ is original input data of the decoder corresponding to an encoding block $B_i$, $R_i{}^n$ is soft information of n iterations corresponding to $B_i$, $W_i{}^n$ is external information calculated by a code block $[B_{i-1}{}^T B_i]$, $A_i{}^n$ is a reliability factor of the external information, a value range of $A_i{}^n$ is (0, 1], a value of $A_{i-1}{}^n$ is 1, and a value of $A_i{}^n$ is $(n-1)/N_1\_itr$, wherein $N_1\_itr$ is an integer greater than 0;

performing repeatedly an output processing, where during performing repeatedly, n=2, . . . $N_2\_itr$, and $N_2\_itr$ is an integer greater than 0;

in a case where the last iteration is performed, performing a following output processing: outputting soft information of the decoder obtained according to a following formula:

$$[R_{i-1}{}^n, R_i{}^n] = [R_{i-1}{}^{n-1}, R_i{}^{n-1}] + W_i{}^n, n = N_2\_itr;$$

performing a hard decision on the soft information obtained by the output processing through a manner of: deciding a symbol bit to be 0 bit or 1 bit by corresponding a symbol bit of an element in the obtained soft information to an encoding rule; and determining first T block data obtained through the hard decision as the third information block, and using the first T block data as output of the decoder.

10. The method of claim 1, wherein selecting the S−T information blocks from the second information block or the third information block comprises:

in a case where hard decoding is performed on the first T encoding blocks in the first information block and the first S−T encoding blocks in the second information block to obtain the third information block, selecting S−T information blocks through a manner of: discarding first T block data in the second information block to obtain the S−T information blocks; or, selecting (2T+1)-th block and N_bh blocks following the (2T+1)-th block from the third information block, and splicing original input data corresponding to soft information of blocks from (T+N_bh+2)-th to S-th in the second information block onto the selected blocks from the third information block to act as the S−T information blocks, where a value range of N_bh is [0, S−T−1]; or in a case where soft decoding is performed on the first T encoding blocks in the first information block and the first S−T encoding blocks in the second information block to obtain the third information block, selecting S−T information blocks through a manner of: selecting data of (2T+1)-th to (S+T)-th blocks from the third information block as the S−T information blocks, wherein a generation method is as follows:

$$[R_{i-1}{}^n, R_i{}^n] = [R_{i-1}{}^0, R_i{}^0] + [A_{i-1}{}^n, A_i{}^n] \times W_i{}^n, n = N_2\_itr;$$

where $R_i{}^n$ is soft information output of n iterations corresponding to $B_i$, and $W_i{}^n$ is external information calculated by a code block $[B_{i-1}{}^T B_i]$, wherein $N_2\_itr$ is an integer greater than 0.

11. An apparatus for decoding a staircase code, applied to a receiving device, comprising: a processor and a memory, wherein the memory comprises stored programs, and the processor is configured to execute the programs to perform:

receiving a staircase code from a transmitting device over a channel;

performing soft information updating on S initial encoding blocks starting from an initial block $B_0{}^T$ in the staircase code to obtain a first information block, and updating last S−T encoding blocks in the first information block and T newly-added encoding blocks to obtain a second information block, wherein the staircase code is a forward error correction (FEC) code having correlation between adjacent codewords and defined based on a structure of a product code, the staircase code has a code structure in a form of a staircase, and S and T are both integers greater than 0;

performing decoding on first T encoding blocks in the first information block and first S−T encoding blocks in the second information block to obtain a third information block, and outputting information of first T blocks in the third information blocks as output of a decoder of the receiving device; and performing repeatedly following operations of: selecting S−T information blocks from the second information block or the third information block, performing the soft information updating on the selected S−T information blocks and the T newly-added encoding blocks to obtain S updated information blocks, and using the S updated information blocks as a new second information block; and performing decoding on information of (T+1)-th to 2T-th blocks in the third information block and information of first S−T blocks in the new second information block to obtain a new third information block, and outputting information of first T blocks in the new third information blocks as output of the decoder of the receiving device.

12. The apparatus of claim 11, wherein in a case where the soft information updating is performed on the S initial encoding blocks in the staircase code to obtain the first information block, performing the soft information updating on the S initial encoding blocks starting from the initial block $B_0{}^T$ in the staircase code to obtain the first information block comprises:

performing the soft information updating on the S initial encoding blocks Bi through $N_1\_itr$ iterations to obtain the first information block, wherein $1 \leq i \leq S$, and $N_1\_itr$ is an integer greater than 0.

13. A non-transitory computer-readable storage medium, comprising stored programs, wherein the programs, when executed, perform:

receiving a staircase code from a transmitting device over a channel;

performing soft information updating on S initial encoding blocks starting from an initial block $B_0{}^T$ in the staircase code to obtain a first information block, and updating last S−T encoding blocks in the first information block and T newly-added encoding blocks to obtain a second information block, wherein the staircase code is a forward error correction (FEC) code having correlation between adjacent codewords and defined based on a structure of a product code, the staircase code has a code structure in a form of a staircase, and S and T are both integers greater than 0;

performing decoding on first T encoding blocks in the first information block and first S−T encoding blocks in the second information block to obtain a third information block, and outputting information of first T blocks in the third information blocks as output of a decoder; and performing repeatedly following operations of: selecting S−T information blocks from the second information block or the third information block, performing the soft information updating on the selected S−T information blocks and the T newly-added encoding blocks to obtain S updated information blocks, and using the S updated information blocks as a new second information block; and performing decoding on information of (T+1)-th to 2T-th blocks in the third information block and information of first S−T blocks in the new second information block to obtain a new third information block, and outputting information of first T blocks in the new third information blocks as output of the decoder.

14. The non-transitory computer-readable storage medium of claim 13, wherein performing the soft information updating on the S initial encoding blocks starting from the initial block $B_0^T$ in the staircase code to obtain the first information block comprises:

performing the soft information updating on the S initial encoding blocks $B_i$ through $N_1\_itr$ iterations to obtain the first information block, wherein $1 \leq i \leq S$, and $N_1\_itr$ is an integer greater than 0.

15. The non-transitory computer-readable storage medium of claim 14, wherein performing the soft information updating on the S initial encoding blocks $B_i$ through the $N_1\_itr$ iterations comprises:

a first updating processing, which is to perform the soft information updating on a code block $[B_{i-1}^T B_i]$, i=1, by a following formula:

$$[R_{i-1}^n, R_i^n] = [R_{i-1}^0, R_i^0] + [A_{i-1}^n, A_i^n] \times W_i^n, n=1,$$

where $R_i^0$ is original input data of the decoder corresponding to $B_i$, $R_i^n$ is soft information of n iterations corresponding to $B_i$, $W_i^n$ is external information calculated by the code block $[B_{i-1}^T B_i]$, $A_i^n$ is a reliability factor of the external information, a value range of $A_i^n$ is (0, 1], a value of $A_{i-1}^n$ is 1, and a value of $A_i^n$ is $n/N_1\_itr$; and a second updating processing, which is to perform the soft information updating on a code block $[R_{i-1}^T B_i]$, i=2, . . . S−1, by the following formula:

$$[R_{i-1}^n, R_i^n] = [R_{i-1}^0, R_i^0] + [A_{i-1}^n, A_i^n] \times W_i^n, n=1,$$

where $A_{i-1}^n$ is greater than or equal to $A_i^n$;

performing repeatedly the first updating process and the second updating process for a code block $[R_{i-1}^T R_i]$, i=1, . . . S−1, where during performing repeatedly, n=2, . . . $N_1\_itr$, $A_i^n$ is greater than or equal to $A_i^{n-1}$, and $N_1\_itr$ is configurable by a register.

16. The non-transitory computer-readable storage medium of claim 13, wherein updating the last S−T encoding blocks in the first information block and the T newly-added encoding blocks to obtain the second information block comprises:

a third updating processing, which is to perform the soft information updating on a code block $[R_{i-1}^T R_i]$, i=1, . . . S−T−1, by a following formula:

$$[R_{i-1}^n, R_i^n] = [R_{i-1}^0, R_i^0] + [A_{i-1}^n, A_i^n] \times W_i^n, n=1,$$

where $R_i^0$ is original input data of the decoder corresponding to an encoding block $B_i$, $R_i^n$ is soft information of n iterations corresponding to $B_i$, $W_i^n$ is external information calculated by a code block $[B_{i-1}^T B_i]$, $A_i^n$ is a reliability factor of the external information, a value range of $A_i^n$ is (0, 1], a value of $A_{i-1}^n$ is 1, and a value of $A_i^n$ is $n/N_1\_itr$, wherein $N_1\_itr$ is an integer greater than 0;

a fourth updating processing, which is to perform the soft information updating on a code block $[R_{i-1}^T B_i]$, i=S−T, by a following formula;

$$[R_{S-T-1}^n, R_{S-T}^n] = [R_{S-T-1}^0, R_{S-T}^0] + [A_{S-T-1}^n, A_{S-T}^n] \times W_i^{n-1}, n=1;$$

a fifth updating processing, which is to perform the soft information updating on a code block $[R_{i-1}^T, B_i]$, i=S−T+1, . . . S−T−1, by the following formula:

$$[R_{i-1}^n, R_i^n] = [R_{i-1}^0, R_i^0] + [A_{i-1}^n, A_i^n] \times W_i^n, n=1;$$ and performing repeatedly the third updating processing, the fourth updating processing and the fifth updating processing to obtain the second information block, where $A_i^n$ is greater than or equal to $A_i^{n-1}$, and during performing repeatedly, n=2, . . . $N_1\_itr$.

* * * * *